United States Patent
Ramakrishnan

[19]

[11] Patent Number: 6,154,085
[45] Date of Patent: Nov. 28, 2000

[54] CONSTANT GATE DRIVE MOS ANALOG SWITCH

[75] Inventor: Shankar Ramakrishnan, Cupertino, Calif.

[73] Assignee: Maxim Integrated Products, Inc., Sunnyvale, Calif.

[21] Appl. No.: 09/149,206

[22] Filed: Sep. 8, 1998

[51] Int. Cl.[7] .................................................. H03K 17/62
[52] U.S. Cl. ........................ 327/404; 327/427; 327/581
[58] Field of Search ................................. 327/419, 425, 327/427, 530, 534, 379, 387, 388, 374–377, 434, 436, 574, 581, 403, 404

[56] References Cited

U.S. PATENT DOCUMENTS

| | | | |
|---|---|---|---|
| 4,467,227 | 8/1984 | Lewyn et al. | 327/389 |
| 4,721,871 | 1/1988 | Kiji et al. | 327/436 |
| 4,857,984 | 8/1989 | Lucas | 327/434 |
| 5,617,055 | 4/1997 | Confalonieri et al. | 327/404 |

FOREIGN PATENT DOCUMENTS

| | | |
|---|---|---|
| 0834857A1 | 4/1998 | European Pat. Off. . |
| 2738424A1 | 3/1997 | France . |
| 3226339A1 | 2/1983 | Germany . |
| 63-090916 | 4/1988 | Japan . |
| 63-098214 | 4/1988 | Japan . |
| 01071323 | 3/1989 | Japan . |
| 02086213 | 3/1990 | Japan . |
| 03085917 | 4/1991 | Japan . |
| 06169247 | 6/1994 | Japan . |
| 08023269 | 1/1996 | Japan . |
| 09167950 | 6/1997 | Japan . |
| 09252241 | 9/1997 | Japan . |
| 09283756 | 10/1997 | Japan . |
| WO97/24807 | 7/1997 | WIPO . |

*Primary Examiner*—Timothy P. Callahan
*Assistant Examiner*—Minh Nguyen
*Attorney, Agent, or Firm*—Blakely, Sokoloff, Taylor & Zafman LLP

[57] ABSTRACT

A constant gate drive metal-oxide semiconductor ("MOS") analog switch. In one embodiment, the analog switch includes first, second, and third devices, and a level shifter. The first device includes a source coupled to an input terminal, a drain coupled to an output terminal, and a gate. The second device includes a source coupled to the input terminal, a drain, and a gate. The third device includes a source coupled to the drain of the second device, a drain coupled to the output terminal, and a gate. The level shifter includes an input coupled to the drain of the second device and an output coupled to the gates of the first, second, and third devices. The level shifter provides a constant gate drive to the first device, regardless of a signal on the input terminal, resulting in a constant on-resistance of the analog switch. In addition, a constant linearity of on-resistance is achieved by keeping the gate voltage constant with respect to the mid-point of the source and drain voltages.

23 Claims, 1 Drawing Sheet

6,154,085

CONSTANT GATE DRIVE MOS ANALOG SWITCH

BACKGROUND OF THE INVENTION

1. Field of the Invention

The present invention relates generally to analog switches, and more specifically, to metal-oxide semiconductor analog switches.

2. Background Information

Flatness of the on-resistance of a metal-oxide semiconductor ("MOS") analog switch is an important parameter in many applications. The conventional way to achieve reasonable flatness over a specified signal range is to have an N-channel MOS transistor and a P-channel MOS transistor connected in parallel. FIG. 1 is a circuit diagram of such a prior art analog switch. As shown, the switch consists of an N-channel MOS device N1 connected in parallel to a P-channel MOS device P1. More specifically, the respective sources and drains of the devices N1 and P1 are coupled together, with the input terminal IN coupled to the sources of the devices N1 and P1, and the output terminal OUT coupled to the drains of the devices N1 and P1. A control terminal CONTROL is coupled to the gate of device N1, and to the gate of device P1 through an inverter I1.

When a signal on the CONTROL terminal is low, both devices N1 and P1 are off, and thus the analog switch is off, prohibiting a signal on the IN terminal to be passed to the OUT terminal. On the other hand, when the CONTROL terminal is high, both devices N1 and P1 are on, and thus the analog switch is on to couple a signal on the IN terminal to the OUT terminal. For a change in input voltage in either direction, the on-resistance variation of the N-channel device N1 is compensated, to a certain extent, by the on-resistance variation of the P-channel device P1 in the opposite direction.

However, this type of analog switch has several drawbacks. One main drawback is that the on-resistances of the N-channel and P-channel devices N1 and P1 do not track each other exactly. Therefore, the on-resistance still shows a variation with the input voltage level, becoming worse as the signal approaches either supply rail. Another drawback to using an N-channel/P-channel combination is that the size of the P-channel device is 3 to 4 times the size of the N-channel device because of the lower hole mobility of silicon. This results in a larger parasitic capacitance and consequently, a reduction in bandwidth.

Accordingly, there is a need in the technology for an analog switch which overcomes the aforementioned drawbacks.

SUMMARY OF THE INVENTION

The present invention comprises an analog switch. In one embodiment, the analog switch includes first, second, and third devices, and a level shifter. The first device includes a source coupled to an input terminal, a drain coupled to an output terminal, and a gate. The second device includes a source coupled to the input terminal, a drain, and a gate. The third device includes a source coupled to the drain of the second device, a drain coupled to the output terminal, and a gate. The level shifter includes an input coupled to the drain of the second device and an output coupled to the gates of the first, second, and third devices.

The level shifter provides a constant gate drive to the first device, regardless of a signal on the input terminal, resulting in a constant on-resistance of the analog switch. Moreover, the present invention achieves a constant linearity of on-resistance by keeping the gate voltage constant with respect to the mid-point of the source and drain voltages.

DETAILED DESCRIPTION

Figure 1:
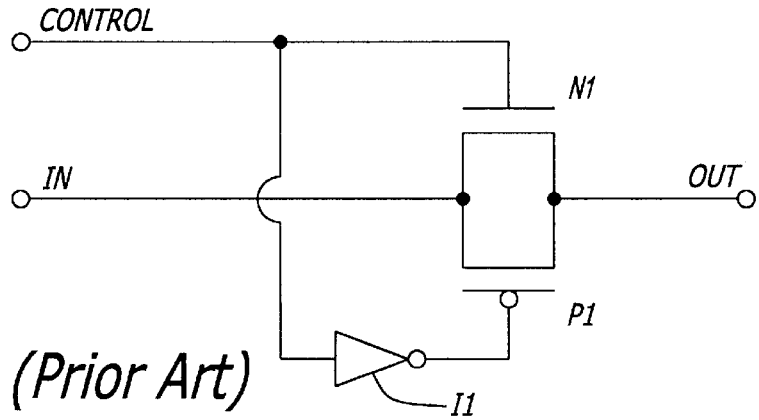
FIG. 1 is a circuit diagram of a prior art analog switch.
Figure 2:
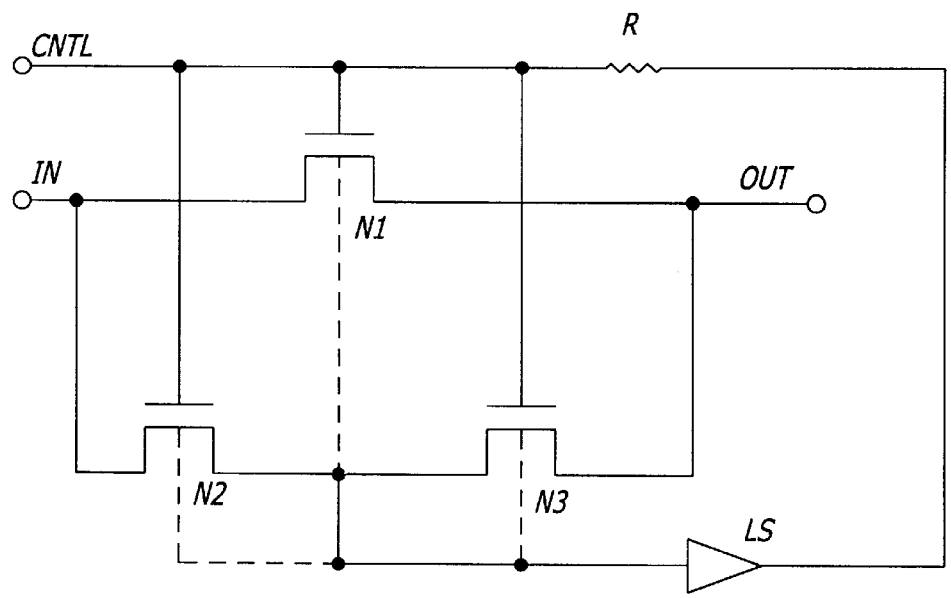
FIG. 2 is a circuit diagram of an analog switch according to one embodiment of the present invention.

FIG. 2 is a circuit diagram of an analog switch according to one embodiment of the present invention. Referring to FIG. 2, the analog switch comprises an N-channel metal-oxide semiconductor ("MOS") device N1 including a source that is coupled to an input terminal IN and a drain coupled to an output terminal OUT. It is desirable to provide a constant gate drive to device N1, regardless of the input signal on the IN terminal in order to maintain a constant on-resistance of the switch. To accomplish this, a voltage level shifter LS is coupled to the gate of device N1 to provide a constant gate to source voltage relative to the source to drain voltage of device N1. For best linearity of on-resistance, the gate voltage of device N1 must be kept constant with respect to the midpoint of the source and drain voltages of device N1. This is accomplished by including two extra N-channel MOS devices of equal size in series across the IN and OUT terminals and connecting the gates of the two extra N-channel devices to the gate of device N.

Accordingly, the analog switch further comprises a second N-channel device N2 and a third N-channel device N3. Device N2 includes a source coupled to the IN terminal, a drain, and a gate coupled to the gate of device N1. Device N3 includes a source coupled to the drain of device N2, a drain coupled to the OUT terminal, and a gate coupled to the gate of device N. Devices N2 and N3 are bilateral devices and the source and drain connections described above are for reference purposes only, as they may be interchanged. Moreover, devices N2 and N3 may be smaller than device N1 to provide the primary switch-on conduction through device N1. The connection point between the drain of device N2 and the source of device N3 is coupled to an input of the voltage level shifter LS. The voltage level shifter LS shifts the signal voltage on the IN terminal by an amount equal to the desired $V_{gs}$ of device N1. The voltage level shifter provides a fixed gate to source voltage with respect to the source to drain voltage for maximum linearity.

The output of the voltage level shifter LS is coupled to the gates of devices N1, N2, and N3. Optionally, a resistor R may be placed in series between the output of the voltage level shifter LS and the gates of devices N1, N2, and N3. The resistor R, together with the gate-to-channel capacitance of devices N1, N2, and N3 form a time constant that is significantly larger than the inverse of the dominant pole of the voltage level shifter. This ensures that, right from direct current to very high frequencies, the gate-channel drive of device N1 is essentially constant, resulting in a switch that is extremely linear.

In addition, an optional control terminal CNTL may be coupled to the gates of devices N1, N2, and N3 to control the same and turn the analog switch on or off. The resistor R allows the control terminal CNTL to be coupled to the gates of devices N1, N2, and N3 for turning the same on and off. In the preferred embodiment, the substrate well connections of devices N1, N2, and N3 are coupled to the input of the voltage level shifter LS, as shown by the dashed lines. However, the substrate well connections of devices N1, N2, and N3 may be grounded, coupled to the sources of the respective devices, or coupled to any other sufficiently low or negative voltage or voltages.

Figure 3:
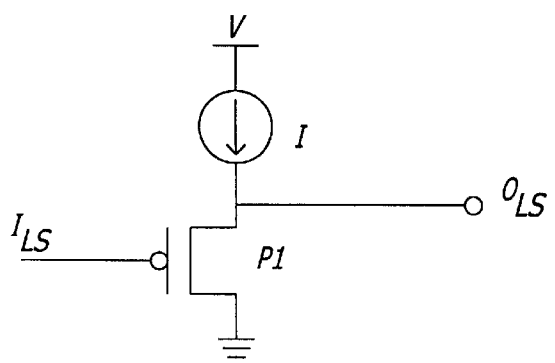
FIG. 3 illustrates an exemplary embodiment of a level shifter of FIG. 2.

FIG. 3 illustrates an exemplary embodiment of a voltage level shifter of FIG. 2. The voltage level shifter LS includes a P-channel device P1 that is connected in a source-follower configuration. That is, device P1 includes a source that is coupled to an output terminal $O_{LS}$, a drain that is coupled to a circuit ground, and a gate that is coupled to an input terminal $I_{LS}$. The voltage level shifter LS further includes a constant current source I coupled between a power supply terminal V and the output terminal $O_{LS}$, providing a constant load at the source of device P1. In the preferred embodiment, the constant current source I comprises an active device such as, for example, a transistor. Alternatively, the constant current source may comprise a passive device such as a resistor.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An analog switch coupled to an input terminal and an output terminal, comprising:
    a first device including a source coupled to the input terminal, a drain coupled to the output terminal, and a gate;
    a second device including a source coupled to the input terminal, a drain, and a gate;
    a third device including a source coupled to the drain of the second device, a drain coupled to the output terminal, and a gate coupled to the gates of the first and second devices; and
    a level shifter including an input coupled to the drain of the second device and an output coupled to the gates of the first, second, and third device, the level shifter providing an approximately constant gate-to-source voltage relative to source-to-drain voltage of the first device.

2. The analog switch of claim 1 further comprising a resistor coupled in series between the output of the level shifter and the gates of the first, second, and third devices.

3. The analog switch of claim 1 wherein the first, second, and third devices are devices of a first conductivity type.

4. The analog switch of claim 3 wherein the level shifter comprises:
    a fourth device of a second conductivity type having a source coupled to an output of the level shifter, a drain coupled to a ground terminal, and a gate coupled to an input of the level shifter; and
    a current source coupled between a power supply terminal and the source of the fourth device.

5. The analog switch of claim 4 wherein the first, second, and third devices are N-channel metal-oxide semiconductor devices and the fourth device is a P-channel metal-oxide semiconductor device.

6. The analog switch of claim 1 wherein the first, second, and third devices are N-channel metal-oxide semiconductor devices.

7. The analog switch of claim 1 wherein each of the first, second, and third devices further comprise a substrate terminal coupled to the input of the level shifter.

8. The analog switch of claim 1 wherein each of the first, second, and third devices further comprise a substrate terminal coupled to a ground terminal.

9. The analog switch of claim 1 wherein each of the first, second, and third devices further comprise a substrate terminal coupled to the sources of the respective devices.

10. The analog switch of claim 1 further comprising a control terminal coupled to the gates of the first, second, and third devices.

11. An analog switch coupled to an input terminal and an output terminal, comprising:
    a first device including a source coupled to the input terminal, a drain coupled to the output terminal, and a gate;
    a circuit coupled to the input terminal, the output terminal, and the gate of the first device; and
    a level shifter including an input coupled to the circuit and an output coupled to the gate of the first device and the circuit, the level shifter providing an approximately constant gate-to-source voltage relative to source-to-drain voltage of the first device.

12. The analog switch of claim 11 wherein the circuit to provide optimal on-resistance linearity of the analog switch.

13. The analog switch of claim 11 wherein the circuit comprises:
    a second device including a source coupled to the input terminal, a drain, and a gate coupled to the gate of the first device; and
    a third device including a source coupled to the drain of the second device and the input of the level shifter, a drain coupled to the output terminal, and a gate coupled to the gate of the first device.

14. The analog switch of claim 11 further comprising a resistor coupled in series between the output of the level shifter and the gate of the first device.

15. The analog switch of claim 11 wherein the level shifter comprises:
    an additional device having a source coupled to an output of the level shifter, a drain coupled to a ground terminal, and a gate coupled to an input of the level shifter; and
    a current source coupled between a power supply terminal and the source of the fourth device.

16. The analog switch of claim 15 wherein the first device is an N-channel metal-oxide semiconductor device and the additional device is a P-channel metal-oxide semiconductor device.

17. The analog switch of claim 15 wherein the first device is a device of a first conductivity type and the additional device is a device of a second conductivity type.

18. The analog switch of claim 11 wherein the first device further comprises a substrate terminal coupled to the input of the level shifter.

19. The analog switch of claim 11 wherein the first device further comprises a substrate terminal coupled to a ground terminal.

20. The analog switch of claim 11 further comprising a control terminal coupled to the gate of the first device.

21. An analog switch coupled to an input terminal and an output terminal, comprising:
    a first device including a source coupled to the input terminal, a drain coupled to the output terminal, and a gate;
    a second device including a first node coupled to the input terminal, a second node, and a gate;

a third device including a first node coupled to the second node of the second device, a second node coupled to the output terminal, and a gate; and a level shifter including an input coupled to the second node of the second device and an output coupled to the gates of the first, second, and third device, the level shifter providing an approximately constant gate-to-source voltage relative to source-to-drain voltage of the first device.

22. The analog switch of claim 21 wherein the first node and the second node of the second device are a drain and a source, respectively.

23. The analog switch of claim 22 wherein the first node and the second node of the third device are a drain and a source, respectively.

\* \* \* \* \*